(12) United States Patent
Wei et al.

(10) Patent No.: US 11,363,735 B2
(45) Date of Patent: Jun. 14, 2022

(54) SEALING ASSEMBLY FOR ELECTRONIC COMPONENT AND UNDERWATER BOOSTER

(71) Applicant: TIANJIN DEEPFAR OCEAN TECHNOLOGY CO., LTD., Tianjin (CN)

(72) Inventors: Jiancang Wei, Tianjin (CN); Shiliang Wu, Tianjin (CN); Shujun Wang, Tianjin (CN); Qing Tong, Tianjin (CN)

(73) Assignee: DEEPINFAR OCEAN TECHNOLOGY INC.

( * ) Notice: Subject to any disclaimer, the term of this patent is extended or adjusted under 35 U.S.C. 154(b) by 0 days.

(21) Appl. No.: 17/263,438

(22) PCT Filed: Jun. 20, 2019

(86) PCT No.: PCT/CN2019/092091
§ 371 (c)(1),
(2) Date: Jan. 26, 2021

(87) PCT Pub. No.: WO2020/024725
PCT Pub. Date: Feb. 6, 2020

(65) Prior Publication Data
US 2021/0392768 A1 Dec. 16, 2021

(30) Foreign Application Priority Data

Aug. 1, 2018 (CN) .......................... 201810865259.0
Aug. 1, 2018 (CN) .......................... 201821231723.2

(51) Int. Cl.
*H05K 5/06* (2006.01)
*H05K 5/02* (2006.01)
(Continued)

(52) U.S. Cl.
CPC .......... *H05K 5/069* (2013.01); *H01M 50/264* (2021.01); *H01M 50/184* (2021.01)

(58) Field of Classification Search
CPC ............. H05K 5/02; H05K 5/06; H05K 5/069
See application file for complete search history.

(56) References Cited

U.S. PATENT DOCUMENTS

| 8,186,005 B2 * | 5/2012 | Stewen | A47L 9/20 15/347 |
|---|---|---|---|
| 2018/0084660 A1 * | 3/2018 | Meguro | H05K 5/069 |
| 2020/0275571 A1 * | 8/2020 | Kunii | H01R 9/223 |

FOREIGN PATENT DOCUMENTS

| CN | 102182825 | 9/2011 |
| CN | 202262164 | 5/2012 |

(Continued)

*Primary Examiner* — Hoa C Nguyen
*Assistant Examiner* — Amol H Patel
(74) *Attorney, Agent, or Firm* — Sand, Sebolt & Wernow Co., LPA (57) ABSTRACT

A sealing assembly for electronic components including a sealing seat and a sealing shell for mounting the electronic component. The sealing shell is received through an opening in the top of the sealing seat and into complementary mounting chamber. A left end of the sealing shell includes a first connection channel; a left end of the mounting chamber includes a second connection channel and a sealing gasket surrounding the second connection channel. A right end of the mounting chamber includes an elastic latch. After installing the sealing shell in the mounting chamber, the elastic latch laterally abuts the sealing shell's right end and is in a lateral compression position, and the first connection channel and the second connection channel are aligned and in sealing communication through the sealing gasket. The elastic latch includes a right backstop to prevent the sealing shell from being vertically detached from the mounting chamber.

20 Claims, 4 Drawing Sheets

(51) Int. Cl.
*H01M 50/264* (2021.01)
*H01M 50/184* (2021.01)

(56) References Cited

FOREIGN PATENT DOCUMENTS

| | | |
|---|---|---|
| CN | 205005396 | 1/2016 |
| CN | 207995582 | 10/2018 |
| CN | 208489267 | 2/2019 |
| CN | 208675637 | 3/2019 |
| CN | 208835138 | 5/2019 |

* cited by examiner

SEALING ASSEMBLY FOR ELECTRONIC COMPONENT AND UNDERWATER BOOSTER

REFERENCES TO RELATED APPLICATIONS

The present disclosure claims all the benefits of the patent application No. 201810865259.0 entitled "Sealing Assembly for Electronic Component and Underwater Booster" and the utility model application No. 201821231723.2 entitled "Sealing Assembly for Electronic Component and Underwater Booster", which were filed on Aug. 1, 2018 before the State Intellectual Property Office of the People's Republic of China, and are incorporated herein by reference in their entirety.

FIELD

The present disclosure generally relates to the field of sealing equipment. In particular, the present disclosure relates to a sealing assembly for electronic component and an underwater booster.

BACKGROUND

Underwater sealing structure is a key design for security of underwater entertainment equipment. The sealing performance directly determines the performance and effect of the entire equipment. The main components of an underwater sealing structure in the prior art comprise a soft material, a pressing terminal face and a pressing method. The pressing method is the key design, which determines the convenience and reliability of an operation. Most of the products in the present consumer goods market adopt terminal face or radial sealing mode. Such a mode ensures the reliability of underwater sealing but sacrifices the convenience of an operation, which results in tedious operations and poor user experience.

A typical terminal face sealing structure comprises a sealing body. The sealing body has a sealing cavity with an upward opening. A soft material and a screw hole are provided on the edge of the opening of the sealing cavity. During the usage of the present structure, a component to be sealed is installed in the sealing cavity. An end cap is disposed on the terminal face of the sealing cavity. The end cap is fastened on the terminal face of the sealing cavity with a screwdriver to let a screw pass through the corresponding screw hole to achieve packaging. However, there are many problems, for example, 1. Screw pressing is a professional operation, which means it cannot be ensured that every user operates correctly;
2. The assembly time is long; and
3. It needs to be disassembled with a tool (for example, a screwdriver) and cannot adapt to frequent disassembly.

SUMMARY

In one aspect, the present disclosure provides a sealing assembly for electronic component comprising a sealing seat and a sealing shell for mounting the electronic component.

wherein the sealing seat is provided with a mounting chamber having an opening on top thereof for receiving the sealing shell, and volume and the shape of the mounting chamber are adapted to the sealing shell.

a left end of the sealing shell is provided with a first connection channel.

a left end of the mounting chamber is provided with a second connection channel and a sealing gasket surrounding the second connection channel, and a right end of the mounting chamber is provided with an elastic latch.

after the sealing shell is installed in the mounting chamber, the elastic latch laterally abuts against the right end of the sealing shell and is in a lateral compression position, and at this moment the first connection channel and the second connection channel are aligned and in sealing communication through the sealing gasket, and the elastic latch also constitutes a right backstop to prevent the sealing shell from being vertically detached from the mounting chamber.

In some embodiments, the sealing seat is provided with a left backstop on an upper part of the left end of the mounting chamber to prevent the sealing shell from being vertically detached from the mounting chamber.

In some embodiments, the left backstop comprises a positioning groove with a downward opening, the upper part of the left end of the sealing shell is provided with a positioning rib matching the positioning groove, and when the positioning rib is accommodated in the positioning groove, the positioning rib constitutes a pivot for pivotally mounting the sealing shell with respect to the sealing seat.

In some embodiments, a limiting portion is provided on the right side of the body of the sealing shell, and during installation of the sealing shell into the mounting chamber, an end portion of the elastic latch abuts against the limiting portion and the elastic latch changes from the expansion position to the tension and retraction position; after the sealing shell is installed in the mounting chamber, the elastic latch partially returns from the tension and retraction position to the lateral compression position.

In some embodiments, the body of the sealing shell has a first height, the limiting portion acts as a slope protruding to the right and has a second height, and the first height is greater than the second height, during installation of the sealing shell into the mounting chamber, an end of the elastic latch rises along the slope and is gradually tensioned, and after the sealing shell is installed in the mounting chamber, the elastic latch rises above the second height to form a right backstop located above the limiting portion.

In some embodiments, a right side wall of the mounting chamber has an inclined surface that matches the slope.

In some embodiments, the limiting portion comprises a protrusion located at a lower right side of the body of the sealing shell, and a recess adjacent to an upside of the protrusion;

during installation of the sealing shell into a mounting chamber, an end of the elastic latch rises and transits to a tension and retraction position along the protrusion; and after the sealing shell is installed in the mounting chamber, the elastic latch rises over the protrusion and enters the recess.

In some embodiments, the limiting portion further comprises a second protrusion adjacent to an upside of a recess.

In some embodiments, the elastic latch is provided with a manual operation member.

In some embodiments, an electronic component comprises a battery and/or an electronic circuit.

In some embodiments, the first channel and the second channel are used to guide a power or signal transmission component.

In another aspect, the present disclosure also provides an underwater booster comprising a cabin body, wherein an electronic component in the cabin body is configured with a sealing assembly for electronic component, wherein the sealing assembly for electronic component comprises a sealing seat and a sealing shell for mounting the electronic component, the sealing seat is provided with a mounting chamber having an opening on top thereof for receiving the sealing shell, and volume and shape of the mounting chamber are adapted to the sealing shell, a left end of the sealing shell is provided with a first connection channel, a left end of the mounting chamber is provided with a second connection channel and a sealing gasket surrounding the second connection channel, and a right end of the mounting chamber is provided with an elastic latch, after the sealing shell is installed in the mounting chamber, the elastic latch laterally abuts against the right end of the sealing shell, and is in a lateral compression position, and at this moment the first connection channel and the second connection channel are aligned and in sealing communication through the sealing gasket, and the elastic latch also constitutes a right backstop to prevent the sealing shell from being vertically detached from the mounting chamber.

In the present disclosure, one terminal face of the mounting chamber of the sealing seat is used as the terminal face to sealingly install the sealing shell. An elastic latch for pressing the sealing shell is provided on the other terminal face of the mounting chamber. Therefore, the employment of multiple screws for an upper end cover and an installation tool can be avoided, which makes disassembly and assembly operations more convenient.

BRIEF DESCRIPTION OF THE DRAWINGS

In order to more clearly illustrate the technical solutions of the embodiments of the present disclosure, the drawings used in the description of the embodiments are briefly introduced below. Obviously, the drawings in the following description are some examples of the present disclosure. For one skilled in the art, other drawings can be obtained based on these drawings without involving inventive work.

DETAILED DESCRIPTION

In order to make the objectives, technical solutions and advantages of examples of the present disclosure clearer, the technical solutions of the present disclosure is described below clearly and completely with reference to the drawings. Obviously, the described examples are only a part of examples of the present disclosure rather than all the examples. Based on the examples in the present disclosure, all other examples obtained by one skilled in the art without involving inventive work fall within the scope of protection of the present disclosure. It should be noted that, in the case of no conflict, the embodiments in the present disclosure and the features in the embodiments can be combined with each other.

Finally, it should be noted in the present disclosure, relational terms such as "first" and "second" are only used to distinguish one entity or operation from another entity or operation, and do not necessarily require or imply that there is any such actual relationship or order between these entities or operations. Moreover, the terms "include" and "comprise", not only includes those elements but those that are not explicitly listed or other elements inherent to such a process, method, article, or device. Without more restrictions, the elements defined by the sentence "include" do not exclude the existence of other identical elements in the process, method, article, or equipment that includes the elements.

As shown in FIG. 1 to FIG. 4, described are schematic structural diagrams of an example of the present disclosure, comprising a sealing seat 100. The sealing seat 100 is provided with a mounting chamber 110 having an upward opening for mounting a sealing shell 200. A sealing gasket 1111 for sealing a first connection channel 210 of the sealing shell 200 is provided on a left end 111 (the orientation description involved in the present disclosure is based on the relative position relationship corresponding to FIG. 1) of the mounting chamber 110. In addition, when the sealing shell 200 is in the shape of a cuboid, five faces thereof are sealed and only one face is provided with the first connection channel 210 for connecting with an external device (electrical connection or communication connection).

Figure 1:
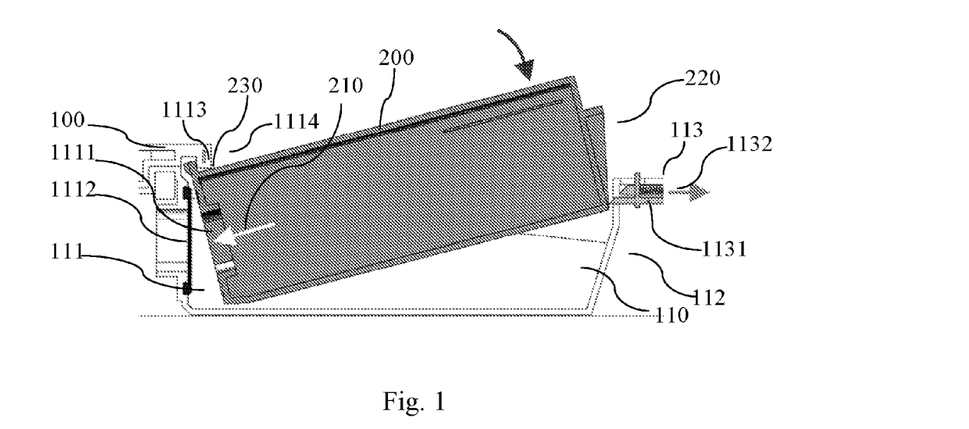
FIG. 1 shows a schematic structural diagram of an embodiment of a sealing assembly for electronic component of the present disclosure in a ready-to-install state.

On a left end 111 of the mounting chamber 110, a second connection channel 1112 is provided at a position corresponding to a first connection channel 210 of the sealing shell 200; the second connection channel 1112 is connected with the first connection channel 210 of the sealing shell so that the communication between the sealing shell 200 and an external cabin body can be achieved (for example, the other end of the second connection channel 1112 is also communicated with another sealing shell). Therefore, sealing communication among sealed cabin bodies can be realized.

A right end 112 of the mounting chamber 110 is provided with an elastic latch 113 for locking the sealing shell. After the sealing shell 200 is installed in the mounting chamber 110, the elastic latch 113 laterally abuts against the right end of the sealing shell 200 and therefore is in a laterally pressed position. Meanwhile, the first connection channel 210 and the second connection channel 1112 are aligned and are in sealing communication through the sealing gasket 1111. The elastic latch 113 also constitutes a right backstop for preventing the sealing shell 200 from being vertically detached from the mounting chamber 110.

In an example of the present disclosure, one terminal face of the mounting chamber 110 of the sealing seat 100 is used as a terminal face to sealingly install the sealing shell 100. An elastic latch for pressing the sealing shell is provided on another terminal face of the mounting chamber. Therefore, the employment of multiple screws for an upper end cover and an installation tool can be avoided. The sealing seat provided in the present disclosure can be applied to an underwater booster or other electronic equipment that require to be sealed and isolated in various application scenarios that require sealing and isolation, such as high and low temperature and high and low air pressure.

The shape of the mounting chamber 110 in an example of the present disclosure is adapted to the shape of the sealing shell 200 to be installed. For example, when a sealing shell is a cubic (or cylindrical), the shape of the corresponding mounting chamber is set to be a rectangular chamber body capable of accommodating the sealing shell (or a chamber body provided with an arched recess at the bottom to fit a cylindrical sealing shell, so that the cylindrical sealing shell can be in fully contact with the installation chamber and stably installed). The sealing shell is a shell used to seal a battery or other electronic circuits. In the following examples of the present disclosure, a rectangular sealing shell is used as an example for illustration.

Figure 2:
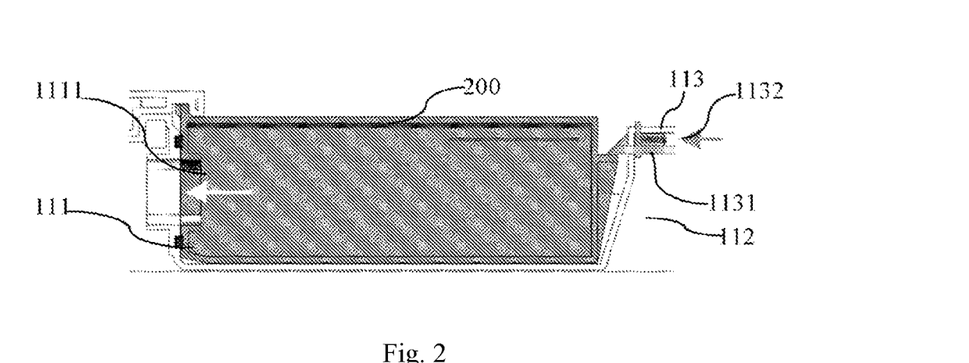
FIG. 2 and FIG. 3 show a schematic structural diagram of an embodiment of a sealing assembly for electronic component of the present disclosure in an installation state.
Figure 3:
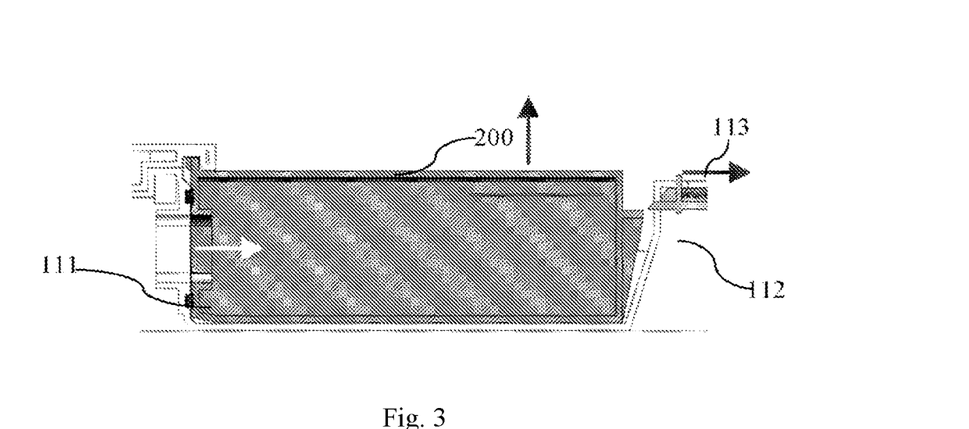

There can be a lock state and a release state for an elastic latch 113 in an example of the present disclosure. As shown in FIG. 2, the elastic latch 113 is in a lock state. In this state, the sealing shell 200 is locked in the sealing seat. As shown in FIGS. 1 and 3, the elastic latch 113 is in a release state. When the elastic latch 113 is in a release state, the sealing shell 200 can be disassembled or installed. When the elastic latch 113 is in a lock state, the elastic latch 113 applies a pressing force to the right end of the sealing shell 200 to make the opening of the sealing shell 200 cooperates with the sealing gasket 113 to achieve the sealing.

As shown in FIG. 1, in some embodiments, the elastic latch 113 comprising: a locking pin 1131 installed on the right end of the mounting chamber and capable of expanding and retracting in the horizontal direction; a spring 1132 used in conjunction with the locking pin 1131. When the spring 1132 is in a first compression state, the elastic latch 113 is in a release state, and when the spring 1132 is in a second compression state, the elastic latch 113 is in a lock state, wherein the degree of compression in the first compression state is greater than that in the second compression state. A shifting piece for controlling the operation of the elastic latch 113 is provided in connection with the locking pin 1131. When a user shifts the shifting piece outward (the first end to the second end direction), the elastic latch 113 is switched to a release state. At this moment, the disassembly or installation of a sealing shell can be conducted. When a user releases the shifting piece, under the elastic force of the spring 1132, the locking pin 1131 protrudes toward the sealing shell 200 and extrudes the sealing shell 200.

Moreover, a limiting portion 220 (which can be a groove or a protrusion provided on the terminal face of the sealing shell 200) is provided at the right end of the sealing shell 200 to cooperate with the locking pin 1131. During the installation of the sealing shell 200 in the mounting chamber, the end of the elastic latch 113 abuts against the limiting portion 220, and the elastic latch 113 changes from an expansion position to a tension and retraction position. After the sealing shell 200 is installed in the mounting chamber 110, the elastic latch 113 is partially restored from the tension and retraction position to the lateral compression position.

For example, the body of the sealing shell 200 has a first height. The limiting portion 220 acts as a slope protruding to the right and has a second height. The first height is greater than the second height. During the installation of the sealing shell 200 into the mounting chamber 110, an end of the elastic latch 113 gradually rises along the slope and becomes tensioned.

After the sealing shell 200 is installed in the mounting chamber 110, the elastic latch 113 rises above the second height to constitute a right backstop located above the limiting portion 220. A right side wall of the mounting chamber 110 has an inclined surface matching the slope.

In some embodiments, when a locking pin 1131 presses the sealing shell 200, the locking pin 1131 cooperates with the limiting portion 220 (groove or protrusion) to limit the sealing shell 200 from falling off the sealing seat 100. Even if a violent impact is incurred, the sealing shell 200 can still be kept from falling off. The sealing shell 200 can be firmly locked without relying solely on the pressing force of the locking pin 1131 on the sealing shell 200. Furthermore, since no excessive pressing force is needed, the pressure of the sealing shell 200 on the sealing gasket 1111 can be appropriately set as well. Therefore, the lifespan of the sealing gasket will not be reduced due to over-pressing for the purpose of locking the sealing shell 200.

In some embodiments, the elastic latch 113 comprises a guide screw of a second end of the mounting chamber 110 penetrating through the mounting chamber, and a compression panel provided on an end of the guide screw facing the sealing shell. The guide screw is along the direction of a first end of the sealing shell to a second end of the sealing shell. When the guide screw is in a first position, the tail end of the sealing shell is pressed. When the guide screw is in a second position, the tail end of the sealing shell is released.

Figure 4:
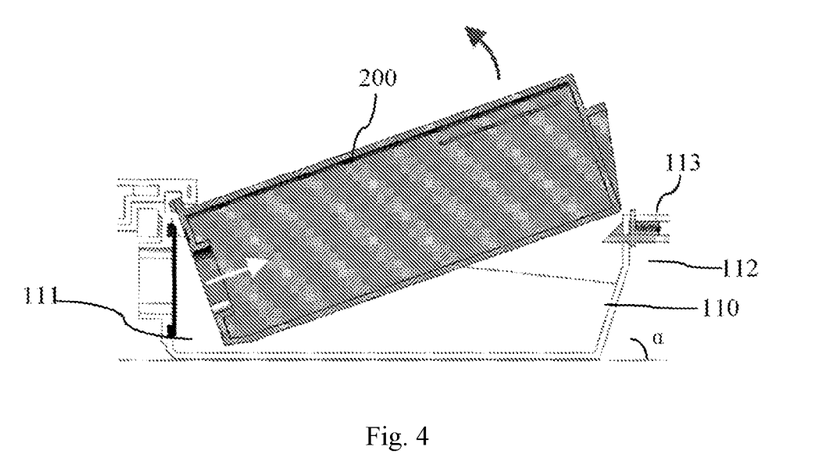
FIG. 4 shows a schematic structural diagram of an embodiment of a sealing assembly for electronic component of the present disclosure in a ready-to-disassemble state.

As shown in FIG. 4, in some embodiments, an inclination angle α is set between a surface of the right end of the mounting chamber 110 and a bottom surface thereof. An optional inclination angle α is set to 70°. Adaptively, the inclination angle α is also set between the corresponding end surface of the sealing shell 200 and the ground of the sealing shell 200. In some embodiments, by setting an inclination angle α, the sealing shell 200 can be enabled to be mounted on the sealing seat 100 smoothly. Since the elastic sealing gasket 1111 is provided on the left end of the mounting chamber 110, the surface of the sealing gasket 1111 and the surface with which it is in contact can have a large coefficient of friction. Therefore, during the installation of the sealing shell 200, it can only be conducted in a manner as shown in FIG. 1. The left end of the sealing shell 200 is firstly placed in the mounting chamber 110 at a certain angle, and then the other end of the sealing shell 200 is pressed down to complete the installation of the sealing shell 200. Such an installation process requires that the length of the mounting chamber 110 is at least longer than the diagonal length of the cross-section of the sealing shell 200 in order to ensure the successful installation of the sealing shell 200. However, after installation, there is a surplus gap between the second end of the mounting chamber 110 and the sealing shell 200, which will increase the volume of the sealing seat and further increase the volume of the electronic equipment using the sealing seat. For fields that have strict requirements on the volume of the device, this kind of unnecessary redundancy is unacceptable and the equipment can be disabled to work properly due to the space redundancy therein. In some embodiments of the present disclosure, the above-mentioned problems are successfully resolved by setting an inclination angle α between the right end of the mounting chamber 110 and the bottom surface of the mounting chamber 110.

As shown in FIG. 1, the upper left end 111 of the mounting chamber 110 is provided with a limiting slot 1113 (formed by enclosure of the left backstop 1114 and the left end 111 of a dark rotation bin). A positioning rib 230 is provided on the corresponding sealing shell 200. The limiting slot 1113 is provided with a downward opening. During the installation of the sealing shell 200, the positioning rib 230 on the sealing shell 200 is placed in the limiting slot 1113, and then the other end of the sealing shell 200 is pressed to install the sealing shell 200 in the sealing seat 100. After being installed in place, since the opening of the limiting slot 1113 is downward and the limiting slot 1113 is closely bound to the positioning rib 230 of the sealing shell 200 from top to bottom, the sealing shell 200 is fastened in the mounting chamber. Meanwhile, the limiting slot 1113 cooperates with the elastic latch 113 to lock the sealing shell 200 more firmly.

As shown in FIG. 4, in some embodiments, the sealing gasket has a first thickness x1 in an uncompressing state. The minimum thickness of the sealing gasket in a compression state is a second thickness x2. The distance between the left end and the right end of the mounting chamber 110 is L (specifically, L is the length of the bottom surface of the mounting chamber 110), and the length of the sealing shell 200 is H. In some embodiments of the present disclosure, L is set to: $x2+H<L<x1+H$. With the design of the present embodiment, when the sealing shell 200 is installed in place, the right end of the mounting chamber 110 itself can realize the compressing effects on the sealing shell. On the other hand, due to such a compact space setting, the utilization of the space is maximized, which reduces the volume of the mounting seat.

Figure 5:
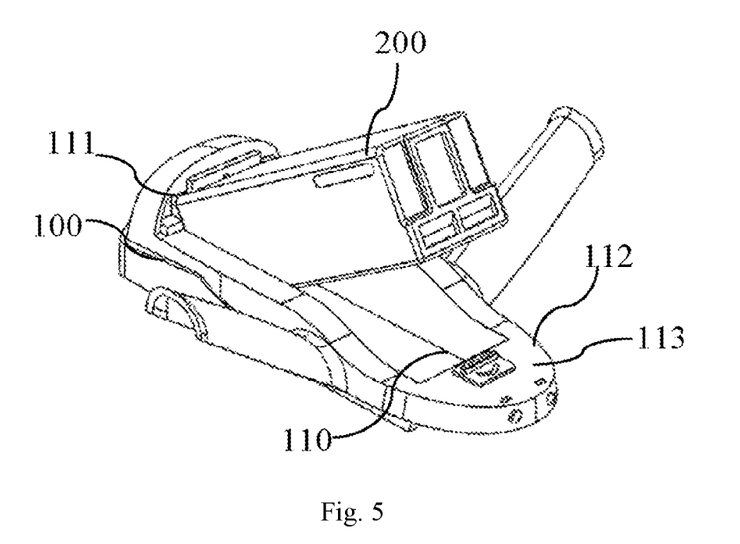
FIG. 5 shows a schematic structural diagram of another embodiment of a sealing assembly for electronic component of the present disclosure in a ready-to-install state.
Figure 6:
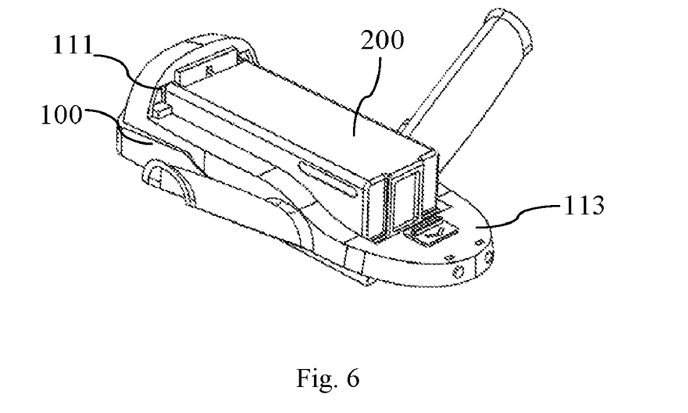
FIG. 6 shows a schematic structural diagram of another embodiment of a sealing assembly for electronic component of the present disclosure in an installation state.

As shown in FIG. 5 and FIG. 6, disclosed are schematic structural diagrams of another embodiment of a sealing assembly for electronic component of the present disclosure, comprising a sealing seat 100, a sealing shell 200 to be installed, a mounting chamber 110 provided in the sealing seat 100, and an elastic latch 113 provided on the right end 112 of the mounting chamber 110.

Figure 7:
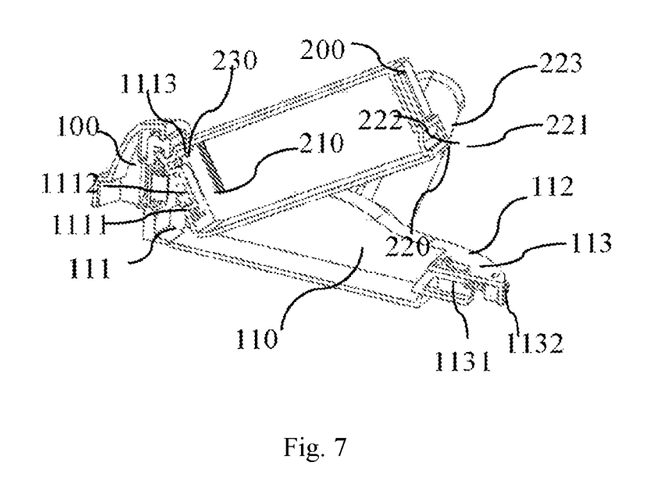
FIG. 7 shows a schematic cross-sectional structural diagram of an embodiment of a sealing assembly for electronic component of the present disclosure in a ready-to-install state.
Figure 8:
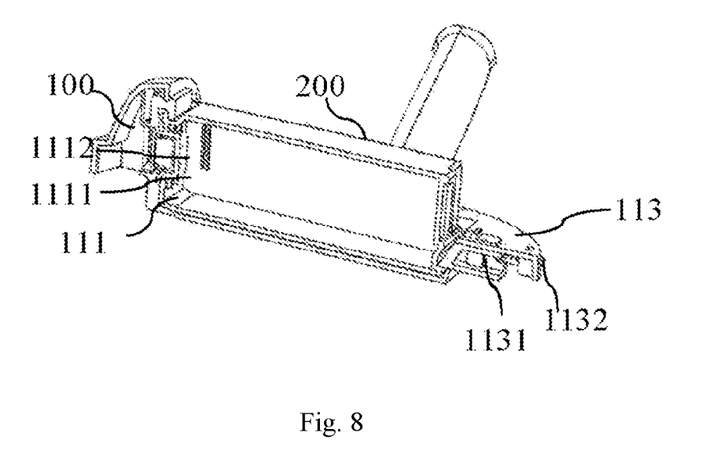
FIG. 8 shows a schematic cross-sectional structural diagram of an embodiment of a sealing assembly for electronic component of the present disclosure in an installation state.

As shown in FIG. 7 and FIG. 8, a sealing assembly for electronic component of the present disclosure comprises a sealing seat 100, a sealing shell 200 to be installed, a mounting chamber 110 provided in a sealing seat 100, and an elastic latch 113 provided on the right end 112 of the mounting chamber 110. The elastic latch 113 comprises a locking pin 1131 and a spring 1132, a sealing gasket 1111 installed on the left end 111 of the mounting chamber 110, and a second connection channel 1112 provided on the left end 111 of the mounting chamber 110. Accordingly, a first connection channel 210 is provided on the sealing shell.

In some embodiments, a limiting portion 220 comprises a first protrusion 221 located at the lower right side of the body of the sealing shell 200 and a recess 222 adjacent to the upper face of the protrusion. During the installation of the sealing shell 200 in the mounting chamber 110, an end of the elastic latch 113 rises and transits into a tension and retraction position along the first protrusion 221. After the sealing shell 200 is installed in the mounting chamber 110, the elastic latch 113 rises over the first protrusion 221 and enters the recess 222. The limiting portion 220 further comprises a second protrusion 223 adjacent to the upside of the recess 222.

In another aspect, the present disclosure also provides an underwater booster comprising a cabin body. Electronic components in the cabin body are configured with a sealing assembly for electronic component of any one of the preceding embodiments.

The example of the equipment described above are only schematic, wherein the units described as separated components may or may not be physically separated, and the components shown as units may or may not be physical united. That is, they can be located at one place, or they can be distributed across multiple elements of the network. Some or all of the modules can be selected according to actual needs to achieve the objective of the solution of the embodiments. It should be noted that the above examples are only used to explain the technical solution of the present disclosure, but not limited thereto. Although the present disclosure has been described in detail with reference to the foregoing examples, one skilled in the art should understand that the technical solutions described in the foregoing examples can still be modified and some equivalent replacements of some of the technical features can be made. These modifications or replacements do not depart the essence of the corresponding technical solutions from the spirit and scope of the technical solutions of the examples in the present disclosure.

What is claimed is:

1. A sealing assembly for electronic component comprising a sealing seat and a sealing shell for mounting the electronic component;
   wherein the sealing seat is provided with a mounting chamber having an opening on top thereof for receiving the sealing shell, and volume and shape of the mounting chamber are adapted to the sealing shell;
   a left end of the sealing shell is provided with a first connection channel;
   a left end of the mounting chamber is provided with a second connection channel and a sealing gasket surrounding the second connection channel; and
   a right end of the mounting chamber is provided with an elastic latch;
   after the sealing shell is installed in the mounting chamber, the elastic latch laterally abuts against the right end of the sealing shell and is in a lateral compression position, and at this moment the first connection channel and the second connection channel are aligned and in sealing communication through the sealing gasket; and
   the elastic latch also constitutes a right backstop to prevent the sealing shell from being vertically detached from the mounting chamber.

2. The sealing assembly for electronic component of claim 1, wherein the sealing seat is provided with a left backstop on an upper part of the left end of the mounting chamber to prevent the sealing shell from being vertically detached from the mounting chamber.

3. The sealing assembly for electronic component of claim 2, wherein the left backstop comprises a positioning groove with a downward opening;
   the upper part of the left end of the sealing shell is provided with a positioning rib matching the positioning groove, and when the positioning rib is accommodated in the positioning groove, the positioning rib constitutes a pivot for pivotally mounting the sealing shell with respect to the sealing seat.

4. The sealing assembly for electronic component of claim 3, a limiting portion is provided on the right side of the body of the sealing shell, and during installation of the sealing shell into the mounting chamber, an end portion of the elastic latch abuts against the limiting portion and the elastic latch changes from an expansion position to a tension and retraction position; and after the sealing shell is installed in the mounting chamber, the elastic latch partially returns from the tension and retraction position to a lateral compression position.

5. The sealing assembly for electronic component of claim 4, wherein the limiting portion comprises a protrusion located at a lower right side of the body of the sealing shell, and a recess adjacent to an upside of the protrusion;
    during installation of the sealing shell into the mounting chamber, the end of the elastic latch rises and transits to the tension and retraction position along the protrusion; and
    after the sealing shell is installed in the mounting chamber, the elastic latch rises over the protrusion and enters the recess.

6. The sealing assembly for electronic component of claim 4, a body of the sealing shell has a first height, the limiting portion acts as a slope protruding to the right and has a second height, and the first height is greater than the second height;
    during installation of the sealing shell into the mounting chamber, an end of the elastic latch rises along the slope and is gradually tensioned; and
    after the sealing shell is installed in the mounting chamber, the elastic latch rises above the second height to form a right backstop located above the limiting portion.

7. The sealing assembly for electronic component of claim 6, wherein a right side wall of the mounting chamber has an inclined surface that matches the slope.

8. The sealing assembly for electronic component of claim 2, a limiting portion is provided on the right side of the body of the sealing shell, and during installation of the sealing shell into the mounting chamber, an end portion of the elastic latch abuts against the limiting portion and the elastic latch changes from an expansion position to a tension and retraction position; and after the sealing shell is installed in the mounting chamber, the elastic latch partially returns from the tension and retraction position to a lateral compression position.

9. The sealing assembly for electronic component of claim 8, a body of the sealing shell has a first height, the limiting portion acts as a slope protruding to the right and has a second height, and the first height is greater than the second height;
    during installation of the sealing shell into the mounting chamber, an end of the elastic latch rises along the slope and is gradually tensioned; and
    after the sealing shell is installed in the mounting chamber, the elastic latch rises above the second height to form a right backstop located above the limiting portion.

10. The sealing assembly for electronic component of claim 9, wherein a right side wall of the mounting chamber has an inclined surface that matches the slope.

11. The sealing assembly for electronic component of claim 8, wherein the limiting portion comprises a protrusion located at a lower right side of the body of the sealing shell, and a recess adjacent to an upside of the protrusion;
    during installation of the sealing shell into the mounting chamber, the end of the elastic latch rises and transits to the tension and retraction position along the protrusion; and
    after the sealing shell is installed in the mounting chamber, the elastic latch rises over the protrusion and enters the recess.

12. The sealing assembly for electronic component of claim 1, a limiting portion is provided on the right side of the body of the sealing shell, and during installation of the sealing shell into the mounting chamber, an end portion of the elastic latch abuts against the limiting portion and the elastic latch changes from an expansion position to a tension and retraction position; and after the sealing shell is installed in the mounting chamber, the elastic latch partially returns from the tension and retraction position to a lateral compression position.

13. The sealing assembly for electronic component of claim 12, a body of the sealing shell has a first height, the limiting portion acts as a slope protruding to the right and has a second height, and the first height is greater than the second height;
    during installation of the sealing shell into the mounting chamber, an end of the elastic latch rises along the slope and is gradually tensioned; and
    after the sealing shell is installed in the mounting chamber, the elastic latch rises above the second height to form a right backstop located above the limiting portion.

14. The sealing assembly for electronic component of claim 13, wherein a right side wall of the mounting chamber has an inclined surface that matches the slope.

15. The sealing assembly for electronic component of claim 14, wherein the limiting portion comprises a protrusion located at a lower right side of the body of the sealing shell, and a recess adjacent to an upside of the protrusion;
    during installation of the sealing shell into the mounting chamber, the end of the elastic latch rises and transits to the tension and retraction position along the protrusion; and
    after the sealing shell is installed in the mounting chamber, the elastic latch rises over the protrusion and enters the recess.

16. The sealing assembly for electronic component of claim 13, wherein the limiting portion comprises a protrusion located at a lower right side of the body of the sealing shell, and a recess adjacent to an upside of the protrusion;
    during installation of the sealing shell into the mounting chamber, the end of the elastic latch rises and transits to the tension and retraction position along the protrusion; and
    after the sealing shell is installed in the mounting chamber, the elastic latch rises over the protrusion and enters the recess.

17. The sealing assembly for electronic component of claim 12, wherein the limiting portion comprises a protrusion located at a lower right side of the body of the sealing shell, and a recess adjacent to an upside of the protrusion;
    during installation of the sealing shell into the mounting chamber, the end of the elastic latch rises and transits to the tension and retraction position along the protrusion; and
    after the sealing shell is installed in the mounting chamber, the elastic latch rises over the protrusion and enters the recess.

18. The sealing assembly for electronic component of claim 17, wherein the limiting portion further comprises a second protrusion adjacent to the upside of the recess.

19. The sealing assembly for electronic component of claim 1, wherein the elastic latch is provided with a manual operation member.

20. An underwater booster, comprising a cabin body, wherein an electronic component in the cabin body is configured with the sealing assembly for electronic component of claim 1.

* * * * *